(12) United States Patent
Schmidtke et al.

(10) Patent No.: US 7,810,653 B2
(45) Date of Patent: Oct. 12, 2010

(54) APPARATUS AND METHOD FOR MOUNTING A DEVICE TO A RACK SYSTEM

(75) Inventors: Gregg S. Schmidtke, Fort Collins, CO (US); Kelly J. Reasoner, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1944 days.

(21) Appl. No.: 10/677,709

(22) Filed: Oct. 2, 2003

(65) Prior Publication Data

US 2005/0072745 A1 Apr. 7, 2005

(51) Int. Cl.
*A47F 7/00* (2006.01)
(52) U.S. Cl. ........................................................ 211/26
(58) Field of Classification Search .................... 211/26, 211/189, 190, 191, 192, 187, 46; 312/257.1; 206/701; 361/829
See application file for complete search history.

(56) References Cited

U.S. PATENT DOCUMENTS

| | | | |
|---|---|---|---|
| 2,789,024 A | 4/1957 | Heisler | |
| 2,809,086 A | 10/1957 | Fall | |
| 3,092,429 A | 6/1963 | Barnes | |
| 3,133,768 A | 5/1964 | Klakovich | |
| 3,367,732 A * | 2/1968 | Beye | 312/332.1 |
| 3,865,445 A * | 2/1975 | Dean et al. | 312/184 |
| 3,999,663 A * | 12/1976 | Walter et al. | 211/175 |
| 4,006,951 A * | 2/1977 | Geer et al. | 312/332.1 |
| 4,114,963 A * | 9/1978 | Menahem | 229/67.2 |
| 4,119,377 A | 10/1978 | Barber et al. | |
| 4,191,436 A | 3/1980 | Cherry | |
| 4,365,831 A * | 12/1982 | Bourne | 292/229 |
| 4,475,657 A * | 10/1984 | Albery | 211/46 |
| 4,482,066 A | 11/1984 | Dykstra | |
| 4,681,381 A | 7/1987 | Sevey | |
| 4,682,833 A | 7/1987 | Ferchan et al. | |
| 4,693,503 A * | 9/1987 | Bisbing | 292/210 |
| 5,046,861 A | 9/1991 | Tarver | |
| 5,570,792 A * | 11/1996 | Huang | 211/46 |
| 5,571,256 A | 11/1996 | Good et al. | |
| 5,833,337 A | 11/1998 | Kofstad | |
| 5,941,621 A | 8/1999 | Boulay et al. | |
| 5,967,337 A * | 10/1999 | Fitzburgh | 211/40 |
| 5,993,099 A * | 11/1999 | Greenberg et al. | 402/4 |
| 6,021,047 A | 2/2000 | Lopez et al. | |
| 6,123,203 A | 9/2000 | Gibbons | |
| 6,123,402 A | 9/2000 | Bowyer et al. | |
| 6,142,590 A | 11/2000 | Harwell | |
| 6,205,029 B1 | 3/2001 | Byrne et al. | |
| 6,209,979 B1 * | 4/2001 | Fall et al. | 312/330.1 |
| 6,220,456 B1 * | 4/2001 | Jensen et al. | 211/26 |
| 6,230,903 B1 * | 5/2001 | Abbott | 211/26 |
| 6,269,959 B1 * | 8/2001 | Haworth | 211/26 |
| 6,288,902 B1 * | 9/2001 | Kim et al. | 361/725 |
| 6,360,900 B1 | 3/2002 | Carbonneau et al. | |
| 6,378,966 B1 * | 4/2002 | Baker et al. | 312/333 |

(Continued)

*Primary Examiner*—Sarah Purol

(57) ABSTRACT

Apparatus and method for mounting a device to a rack system. One embodiment of a system comprises a frame assembly. At least two rails mounted on opposite sides of the frame assembly. A plurality of hangers provided on opposite sides of the device retracting to fit the device into the frame assembly between the at least two rails. The plurality of hangers engaging the at least two rails to support the device on the at least two rails in the frame assembly.

11 Claims, 7 Drawing Sheets

U.S. PATENT DOCUMENTS

| | | | |
|---|---|---|---|
| 6,422,399 B1 | 7/2002 | Castillo et al. | |
| 6,424,534 B1 | 7/2002 | Mayer et al. | |
| 6,557,701 B1 * | 5/2003 | Chen | 206/308.1 |
| 6,601,713 B2 * | 8/2003 | Kaminski | 211/26 |
| 6,702,124 B2 * | 3/2004 | Lauchner et al. | 211/26 |
| 6,764,149 B2 * | 7/2004 | Jurja | 312/333 |
| 6,891,727 B2 * | 5/2005 | Dittus et al. | 361/724 |
| 6,948,691 B2 * | 9/2005 | Brock et al. | 248/222.13 |
| D527,051 S * | 8/2006 | Moy | D19/90 |
| 7,453,698 B2 * | 11/2008 | Cox et al. | 361/726 |
| 2001/0037985 A1 | 11/2001 | Varghese et al. | |
| 2001/0040142 A1 | 11/2001 | Haney | |
| 2002/0043914 A1 | 4/2002 | Munday et al. | |
| 2002/0084734 A1 | 7/2002 | Shih | |
| 2002/0158556 A1 | 10/2002 | Cheng | |
| 2002/0195408 A1 | 12/2002 | Hegrenes et al. | |
| 2004/0189021 A1 * | 9/2004 | Eckerdt | 292/341.15 |
| 2004/0209502 A1 * | 10/2004 | Siahpolo et al. | 439/157 |
| 2004/0217073 A1 * | 11/2004 | Dobler et al. | 211/26 |

* cited by examiner

APPARATUS AND METHOD FOR MOUNTING A DEVICE TO A RACK SYSTEM

FIELD OF THE INVENTION

The invention generally pertains to rack systems, and more specifically, to apparatus and methods for mounting a device to a rack system.

BACKGROUND

Rack systems are available for storing devices, such as computer servers and other electronic devices, in a manner that minimizes storage space and provides ready access to the front panel of each of the devices. The devices are typically stacked adjacent one another in the rack system to minimize space required to store the devices.

The devices can be permanently mounted to the rack system using conventional fasteners (e.g., screws). Such an arrangement, however, makes it difficult to replace devices, service devices, or access the back side of the device (e.g., ports and connections on the back side).

Alternatively, shelves or "L-shaped" brackets may be mounted to the rack system to support the devices in the rack system. Devices can be readily inserted and removed by sliding the device into place on the shelf or L-shaped brackets. In addition, the device can be slid part way out from the shelf or L-shaped brackets to access the back side of the device. However, the user intending to slide the device only partially out from the rack system may inadvertently slide the device off of the shelf or L-shaped brackets and drop the device. In addition, shelves and L-shaped brackets take up space in the rack system between adjacent devices, increasing vertical overhead and reducing the space available for storing devices in the rack system.

Drawers may also be provided to support the devices in the rack system. Again, the devices can be readily inserted and removed by sliding the drawer in and out of the rack system. However, the drawers also take up space in the rack system between adjacent devices.

SUMMARY OF THE INVENTION

Apparatus for mounting a device to a rack system may comprise a frame assembly. At least two rails mounted on opposite sides of the frame assembly. A plurality of hangers provided on opposite sides of the device, the plurality of hangers retracting to fit the device into the frame assembly between the at least two rails. The plurality of hangers engaging the at least two rails to support the device on the at least two rails in the frame assembly.

A method for mounting a device to a rack system may comprise mounting at least two rails on opposite sides of the rack system, retracting a plurality of hangers on the device, positioning the device in the rack system between the at least two rails, and releasing the plurality of hangers on the device to engage the at least two rails and support the device on the rack system.

BRIEF DESCRIPTION OF THE DRAWINGS

Illustrative embodiments in accordance with the invention are shown in the drawings, in which.

DETAILED DESCRIPTION

Figure 1:
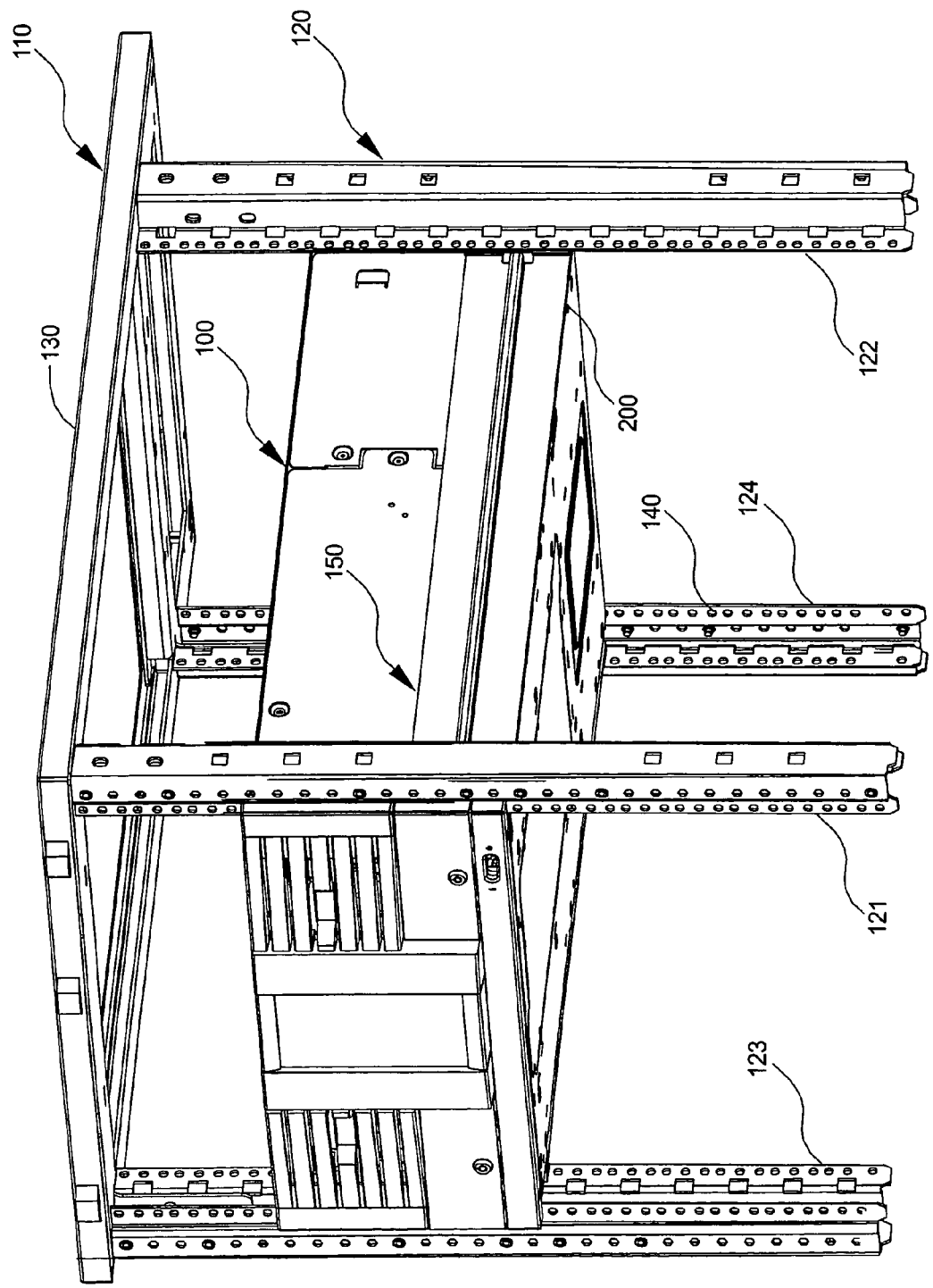
FIG. 1 is a perspective view showing a device mounted to a rack system according to embodiments of the invention.

Device 100 is shown in FIG. 1 as it may mounted to a rack system 110 according to an embodiment of the invention. It is noted that although the invention is shown and described herein as it may be used to mount electronic devices having a generally rectangular configuration (e.g., server computers, routers, disk storage), the invention is not limited to use with electronic devices and may be used in conjunction with any of a wide range of other types and configurations of devices.

Briefly, rack system 110 may comprise a frame assembly 120 having a plurality of posts 121, 122, 123, and 124. The rack system may also comprise an optional upper platform 130 and/or base 131 (see FIG. 5) to maintain the posts 121, 122, 123, and 124 in fixed relation to one another.

Each post 121, 122, 123, and 124 (hereinafter, generally referred to as 121 unless referring to a specific post) has a plurality of openings 140 formed therein. The openings 140 are preferably spaced apart from one another by a distance that allows different sizes of devices 100 to be mounted to the rack system 110 in any of a wide variety of different positions while leaving little, if any, space (or "gaps") between devices mounted adjacent one another. That is, there is little or no vertical overhead between the devices 100 mounted to the rack 110.

According to one embodiment of the invention, the rack system 110 conforms to Electronics Industry Association (EIA) standards. One EIA unit (or "U") is currently defined as having a height of 44.5 millimeters (mm) or 1.75 inches (in). Electronic equipment height is often specified in EIA units. For example, equipment having a height of 44.5 mm may be referred to as one EIA unit, or "1U". Likewise, equipment having a height of 89 mm may be referred to as two EIA units or "2U", and so forth.

EIA also specifies that devices 100 conforming to EIA standards be no wider than 450 mm (17.72 in). In addition, EIA also defines uniform, aligned hole spacing for mounting the devices 100 to the rack systems 110. Equipment that is sized according to EIA standards may be readily mounted to standard EIA rack systems.

Rack systems 110, such as the one just described, are readily commercially available from various manufacturers. However, it is understood that the scope of the present invention is not limited to such an embodiment and other rack systems or cabinets now known or later developed may also be used according to the teachings of the invention. Likewise, the rack system 110 need not conform to uniform industry standards (e.g., EIA standards) and may be used with other device storage systems, including but not limited to manufacturer-specific systems.

Figure 2:
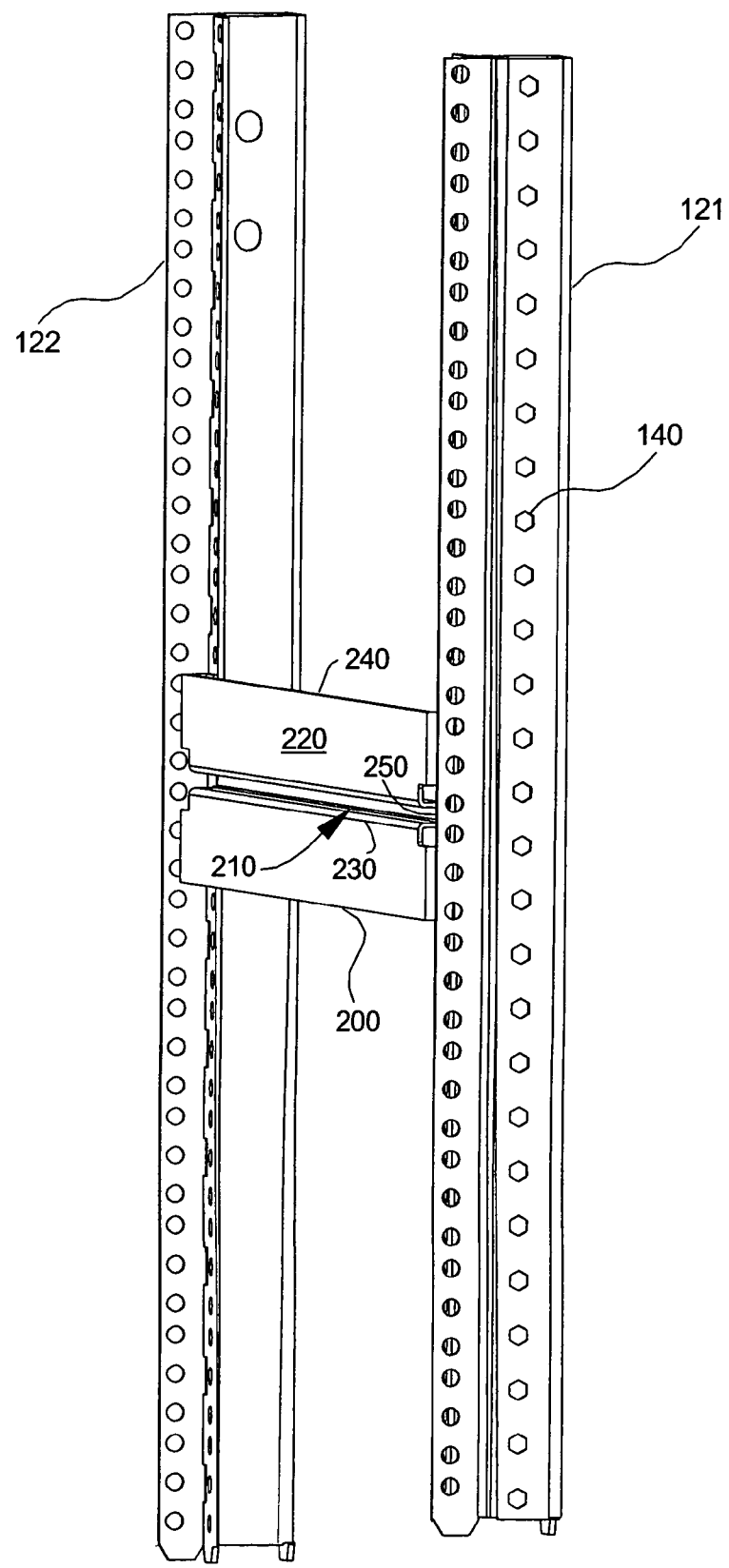
FIG. 2 is a partial perspective view of the rack system showing one embodiment of a rail for mounting the device to the rack system.
Figure 3:
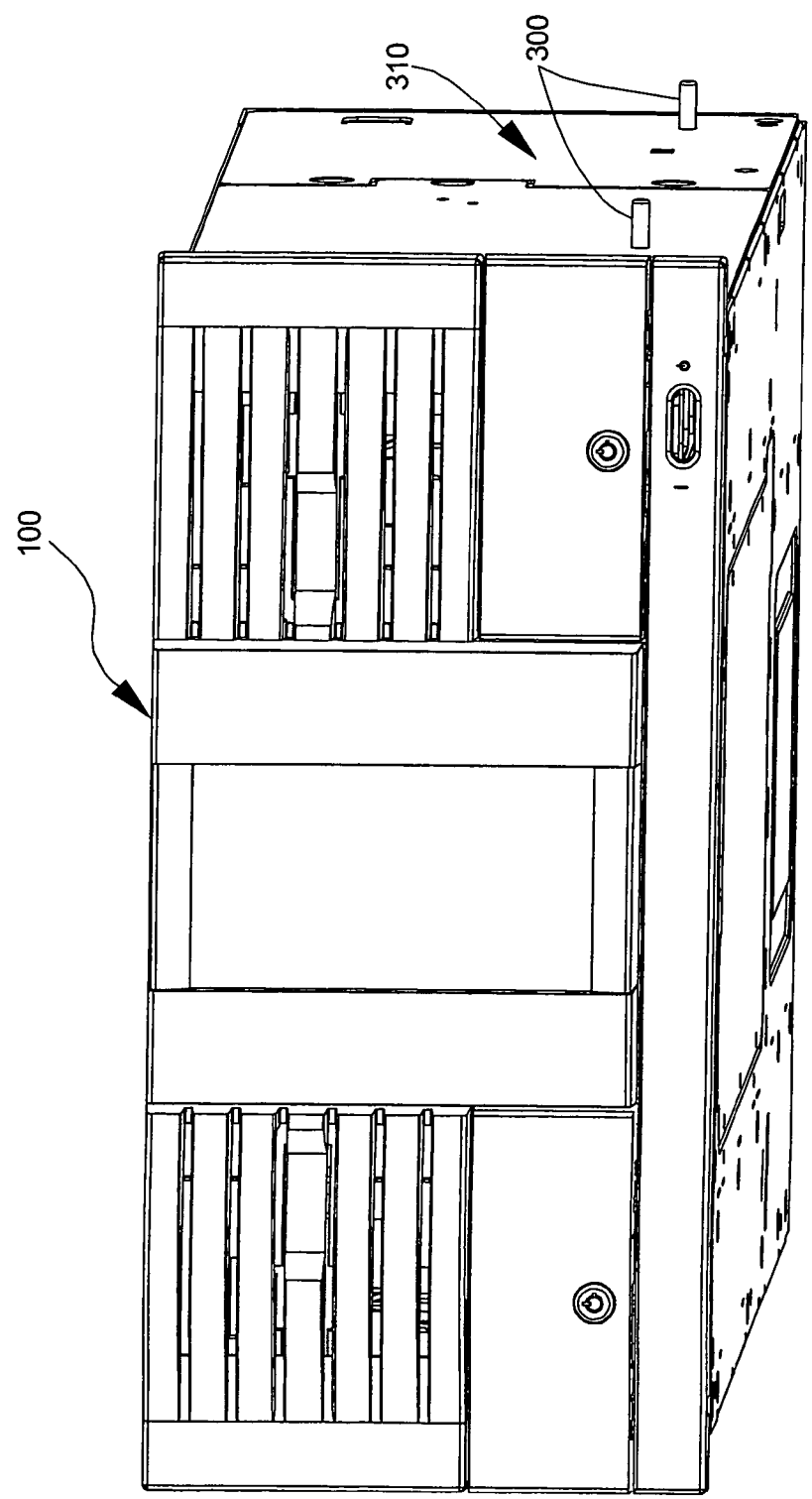
FIG. 3 is a perspective view of the device showing one embodiment of hangers for mounting the device to the rack system.

According to the teachings of the invention, apparatus 150 may be provided for mounting device 100 to rack system 110, as shown in FIG. 1. Apparatus 150 may comprise a rail 200 (FIGS. 1 and 2) and hangers 300 (FIG. 3). Rail 200 may be coupled to the rack system 110 between adjacent posts 121, 122 as shown in FIG. 2.

Channel 210 may be provided in the face 201 of rail 200. In another embodiment, however, the rail 200 may comprise a channel 210 formed on opposing faces of rail 200. Alternatively, the rail 200 may comprise an opening formed through the rail 200 to receive hangers 300 from a device 100 positioned adjacent either side of rail 200. In yet another embodiment the rail need not comprise a channel at all, and instead the hangers 300 can rest on the top portion 240 (see FIG. 2) of rail 200.

Briefly, channel 210 receives hangers 300 when the device 100 is positioned adjacent rail 200 in the rack system 110. Methods of operation will be described in more detail below with reference to FIG. 5.

In one embodiment, rail 200 may comprise a flat face 220 with a beveled or "rounded" edge 230 adjacent channel 210. Although the invention is not limited to such a design, it will be appreciated that this design allows the hangers 300 to be readily slid over and received in the channel 210, even when the hangers 300 are not aligned with the channel 210 during installation, as will be described in more detail below.

Of course it is understood that rail 200 may be manufactured of any suitable material. In one embodiment, rail 200 is manufactured of sheet metal. However, in other embodiments, rail 200 may also be manufactured from steel, plastic, composite material, or a combination thereof. Likewise, channel 210 need not be molded as part of the rail 200 and may be provided as a separate component.

Rail 200 may be mounted to adjacent posts 121, 122 of rack system 110, as shown in FIG. 2. Another rail 201 is preferably mounted to adjacent posts 123, 124 on the opposite side of the rack system 110 (see FIG. 5). Rails 200, 201 will be generally referred to herein by reference number 200, unless referring to a specific rail 200, 201.

Rails 200 may be mounted to the posts 121 in any suitable manner. Preferably, rails 200 are removably mounted to the posts 121. For example, rails 200 may be coupled to the posts 121 by bolts fitted through openings 140 formed in the posts 121. Of course other suitable fastening means may also be used, such as, but not limited to screws, rivets, clips, pins, latches, clamps, hooks. Rails 200 may also be permanently or semi-permanently mounted (e.g., using bonding adhesive, or welding).

According to one embodiment shown and described herein, the channel 210 is formed on one side of the rail 200. The rail 200 is therefore coupled to posts 121 so that the channel 210 faces toward the device 100. It is understood, however, that the scope of the present invention is not limited to such a configuration. As discussed above, the channel 210 may be provided on both sides of the rail 200, through the rail 200, or not provided at all. In such embodiments the rail 200 can be suitably mounted to the rack system 110.

Figure 5:
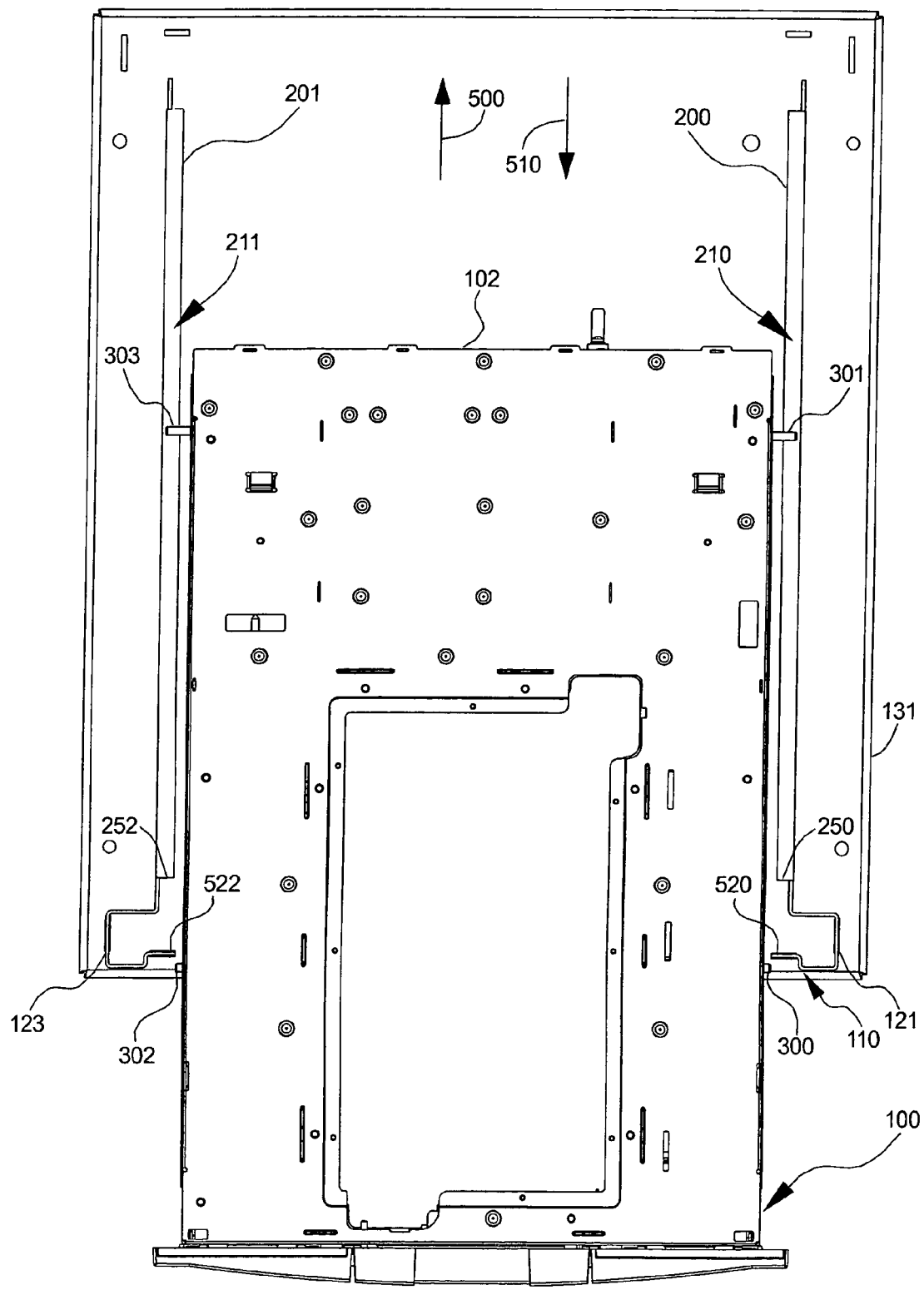
FIG. 5 is a top plan view of the device illustrating one embodiment for mounting the device to the rack system.

Hangers 300 are shown in FIG. 3 according to one embodiment of the invention. A plurality of hangers 300 may be provided on the sides 310 of device 100. Preferably, four hangers 300 are provided on the device 100, two on each side, as shown in FIG. 5.

According to this embodiment, hangers 300 are generally cylindrical shaped to readily slide through channel 210 formed in rail 200. Such an embodiment enables the device 100 to readily slide in and out of the rack system 110 (e.g., providing access to ports on the back side of the device 100).

Of course, it will be readily appreciated by one skilled in the art after having become familiar with the teachings of the invention that the hangers 300 may be any suitable shape and are not limited to such an embodiment. For example, hangers 300 may be disk-shaped, spherical or semi-spherical, square, or rectangular, to name only a few other shapes. Likewise, hangers 300 may be triangular, as described for another embodiment of the invention shown in FIGS. 6 and 7.

Figure 4A:
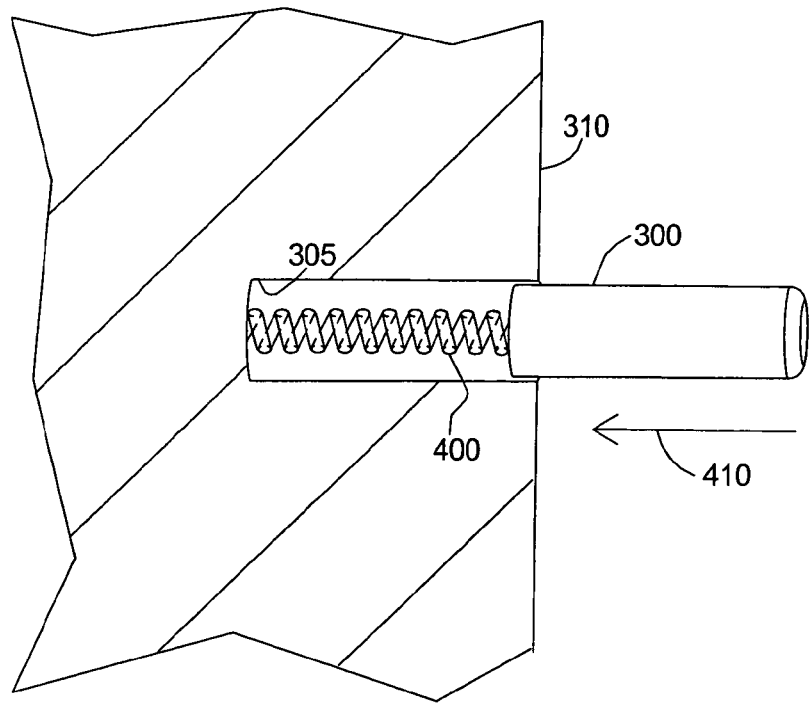
FIG. 4 is a detailed side view of one of the hangers shown in FIG. 3, wherein the hanger is in (a) an expanded position, and (b) a retracted position.
Figure 4B:
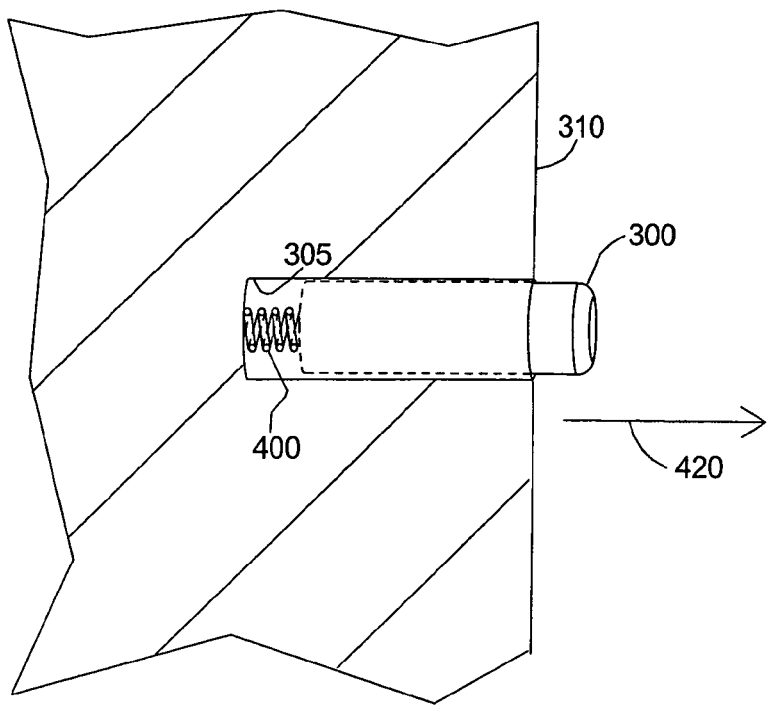

Preferably, the hangers 300 are retractable. In one embodiment shown in FIGS. 4(*a*) and (*b*), hangers 300 are biased by springs 400. This embodiment allows the hangers 300 to be manually retracted into chamber 305 formed in the side 310 of device 100 in the direction illustrated by arrow 410 in FIG. 4(*a*). When the hangers 300 are released, they automatically expand or eject from chamber 305 formed in the side 310 of device 100 in the direction illustrated by arrow 420 in FIG. 4(*b*).

Operation of the invention will now be described in more detail with reference to FIG. 5. By way of illustration, a user desiring to mount the device 100 to rack system 110 may stand adjacent the rack system 110 holding device 100 in front of him or herself. The user retracts hangers 301 and 303 (e.g., using his or her fingers), as described above with reference to FIGS. 4(*a*) and (*b*). The user positions the device 100 between the posts 121 and 123 of rack system 110 by moving the device 100 in the direction of arrow 500. Once the hangers 301, 303 have passed or "cleared" posts 121 and 123 (e.g., post edge 520, 522), the user can release the hangers 301, 303. When the hangers 301, 303 are released, they expand and are received in channels 210, 211 of rails 200, 201.

The user continues by sliding the device 100 toward the back of the rack system 110, in the direction illustrated by arrow 500. As hangers 300, 302 approach the posts 121, 123 of rack system 110, the user retracts hangers 300, 302 (e.g., using his or her fingers) and continues to move the device 100 in the direction illustrated by arrow 500. Once the hangers 300, 302 have passed or "cleared" post edges 520, 522 the user can release the hangers 300, 302. The hangers 301, 303 expand and are received in channels 210, 211 of rails 200, 201.

It is noted that the hangers 300 need not be aligned with channels 210 before being released. The user may instead release hanger 300 on the face 220 of rail 200 (see FIG. 2) and then move the device 100 to align hanger 300 with the channel 210. When the hanger 300 is aligned with channel 210, it expands and is received in the channel 210.

If it is desired to access the back side 102 of the device 100 (e.g., ports, cables, switches, etc. provided on the back side 102), the user can pull the device 100 out from rack system 110 in the direction illustrated by arrow 510. Hangers 300 serve as a guide allowing the device 100 to slide along rails 200, 201 similar to the operation of a drawer.

It is noted that the hangers 300 may also serve to maintain the device 100 in the rack system 110 as the device 100 is being slid outward from the rack system 110. That is, as the user pulls the device 100 in the direction illustrated by arrow 510, the device 100 slides through channel 210 until the hangers 300, 302 reach the forward portion of channels 210, 211 or the post edges 520, 522. At this point, the hangers 300, 302 engage the forward portion of channels 210, 211 or the post edges 520, 522 and stop the device 100 from traveling any further in the direction illustrated by arrow 510.

To continue moving the device 100 in the direction illustrated by arrow 510, the user retracts the hangers 300, 302 to pass or "clear" post edges 520, 522.

Accordingly, if it is desired to remove the device 100 from rack system 110, the user can pull the device 100 in the direction illustrated by arrow 510, retract the hangers 300 to pass or "clear" post edges 520, 522 and continue pulling the device 100 in the direction illustrated by arrow 510. The user can repeat this process for all of the hangers provided on the device 100.

Figure 6:
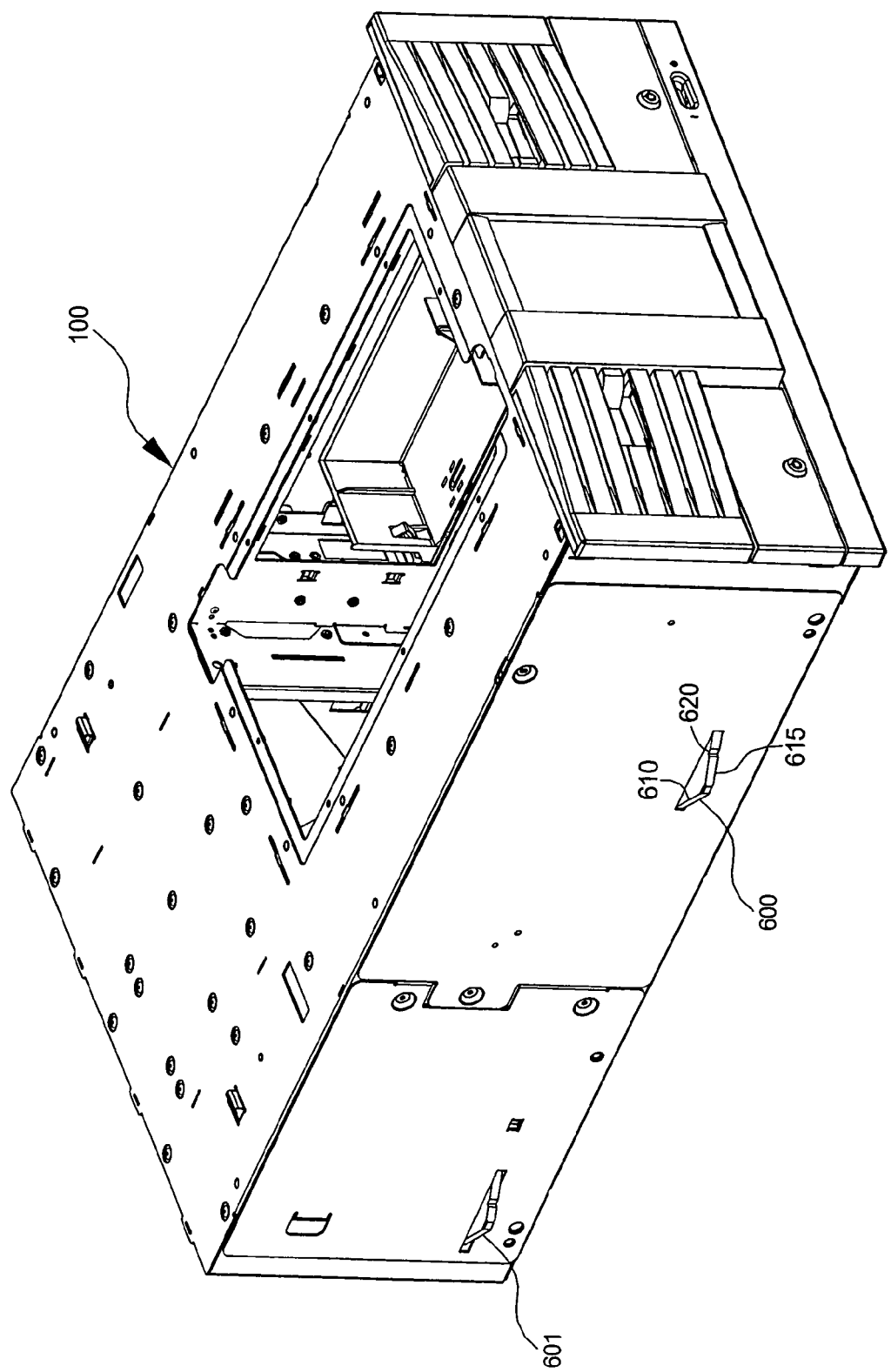
FIG. 6 is a perspective view of the device showing another embodiment of the hangers for mounting the device to the rack system.
Figure 7:
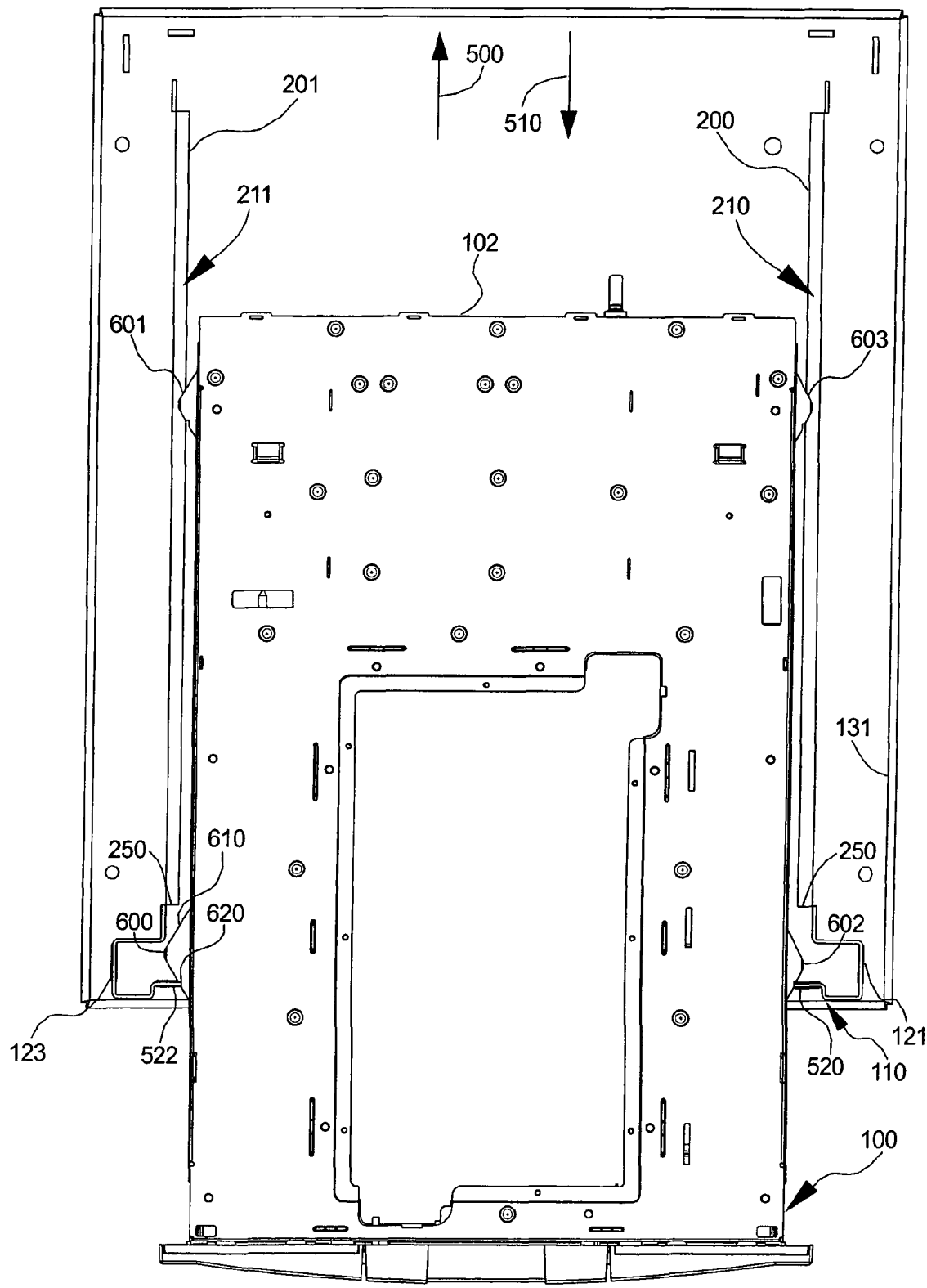
FIG. 7 is a top plan view of the device illustrating another embodiment for mounting the device to the rack system.

An alternative embodiment of the hangers for use with apparatus 150 is shown in FIGS. 6 and 7. Again, four hangers 600, 601, 602, 603 (hereinafter generally referred to as 600, unless referring to specific hangers) are preferably provided on the device 100. According to the embodiment shown, two hangers 600 are provided on each side of device 100, as shown in FIG. 7.

According to this embodiment, hangers 600 are triangular-shaped. Hangers 600 may comprise a sloped surface or ramp portion 610. One or more of the hangers 600 may also comprise optional stop portion 620.

As previously discussed with regard to embodiment 300, hangers 600 may be any suitable shape. For example, ramp portion 610 may be semi-circular or semi-spherical.

Also as previously discussed, hangers 600 are preferably retractable. In one embodiment, hangers 600 are spring-biased, allowing the hangers 600 to be retracted and to automatically expand similarly to that described with reference to FIGS. 4(*a*) and (*b*).

Device 100 may be mounted to rack system 110 similarly to that described above with regard to embodiment 300 of the hangers. However, in this embodiment 600, the ramp portion 610 enables the support to be automatically retracted as the device 100 is positioned between posts 121, 123 of the rack system 110. That is, as the device 100 is moved between posts 121, 123 in the direction illustrated by arrow 500, post edges 620, 622 engage the ramp portion 610 and ride up the sloped surface, automatically retracting the hangers 600 so that the device can be positioned between the rails 200, 201 in the rack system 110 without user intervention.

In addition, the stop portion 620 provided with this embodiment serves to keep the device 100 from being inadvertently removed from the rack system 110. That is, as the device 100 is pulled out of the rack system 110 in the direction illustrated by arrow 510, stop portion 620 engages the post edges 520, 522 and stops the device 100 from being withdrawn any further from rack system 110. The user must depress the hanger(s) 600 to clear post edges 520, 522 and continue withdrawing the device 100 from the rack system 110.

It will become readily apparent to those skilled in the art after having become familiar with the teachings of the present invention that the apparatus and method for mounting the device 100 to the rack system enable a compact rack mounting technique which maximizes the volume available for storing devices 100. The invention does not require the use of slides (which increase the effective device width), or shelves, drawers, or "L" brackets required (which all increase the effective device height).

What is claimed is:

1. An apparatus for mounting an electronic device to a rack system, comprising:
   a frame assembly;
   at least two rails mounted on opposite sides of the frame assembly; and
   a plurality of hangers provided on opposite sides of the electronic device, said plurality of hangers retracting into the opposite sides so the electronic device can fit into said frame assembly between said at least two rails and then said plurality of hangers expanding from the opposite sides to engage said at least two rails and to support the electronic device on said at least two rails in the frame assembly and wherein two of said plurality of hangers are provided on opposite sides of the electronic device and biasably expand from chambers formed in the opposite sides.

2. The apparatus of claim 1, wherein the plurality of hangers slide in a channel formed in each of said at least two rails as the electronic device slides into and out of the frame assembly.

3. The apparatus of claim 1, wherein said plurality of hangers biasably release from the opposite sides to engage said at least two rails.

4. The apparatus of claim 1, wherein the electronic device is a computer server, router, or disk storage.

5. The apparatus of claim 1, wherein said frame assembly comprises a plurality of posts, the electronic device is supported in said frame assembly between said plurality of posts.

6. The apparatus of claim 1, wherein said at least two rails are mounted between adjacent posts of said frame assembly.

7. The apparatus of claim 1, wherein said plurality of hangers are cylindrical.

8. The apparatus of claim 1, wherein said plurality of hangers are triangular-shaped.

9. An apparatus for mounting an electronic device to a rack system, comprising:
   a frame assembly;
   at least two rails mounted on opposite sides of the frame assembly; and
   a plurality of hangers provided on opposite sides of the electronic device, said plurality of hangers retracting into the opposite sides so the electronic device can fit into said frame assembly between said at least two rails and then said plurality of hangers expanding from the opposite sides to engage said at least two rails and to support the electronic device on said at least two rails in the frame assembly and wherein at least one of said plurality of hangers comprises a ramp portion and wherein the ramp portion engages said frame assembly to automatically retract the at least one hanger.

10. The apparatus of claim 1, wherein at least one of said plurality of hangers comprises a stop portion.

11. The apparatus of claim 10, wherein the stop portion engages said frame assembly to prevent said electronic device from sliding beyond a predetermined position in said frame assembly.

* * * * *